US011410875B2

(12) United States Patent
Nguyen et al.

(10) Patent No.: US 11,410,875 B2
(45) Date of Patent: Aug. 9, 2022

(54) FAN-OUT ELECTRONIC DEVICE

(71) Applicant: TEXAS INSTRUMENTS INCORPORATED, Dallas, TX (US)

(72) Inventors: Hau Thanh Nguyen, San Jose, CA (US); Woochan Kim, Sunnyvale, CA (US); Yi Yan, Sunnyvale, CA (US); Luu Thanh Nguyen, San Jose, CA (US); Ashok Prabhu, San Jose, CA (US); Anindya Poddar, Sunnyvale, CA (US); Masamitsu Matsuura, Oita (JP); Kengo Aoya, Oita (JP); Mutsumi Masumoto, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/225,875

(22) Filed: Dec. 19, 2018

(65) Prior Publication Data
US 2020/0203219 A1  Jun. 25, 2020

(51) Int. Cl.
*H01L 21/768* (2006.01)
*H01L 23/528* (2006.01)
(Continued)

(52) U.S. Cl.
CPC .. *H01L 21/76816* (2013.01); *H01L 21/76817* (2013.01); *H01L 21/76897* (2013.01);
(Continued)

(58) Field of Classification Search
CPC ............. H01L 23/3142; H01L 23/3121; H01L 23/3135
See application file for complete search history.

(56) References Cited

U.S. PATENT DOCUMENTS 5,547,740 A * 8/1996 Higdon ................. H01L 23/525
228/180.21
7,327,032 B2 * 2/2008 Yoon ...................... H01L 24/48
257/737

(Continued)

OTHER PUBLICATIONS

J. Oberhammer and G. Stemme, "Contact printing for improved bond-strength of patterned adhesive full-wafer bonded 0-level packages," 17th IEEE International Conference on Micro Electro Mechanical Systems. Maastricht MEMS 2004 Technical Digest, 2004, pp. 713-716, doi: 10.1109/MEMS.2004.1290684. (Year: 2004).*

*Primary Examiner* — Vincent Wall
(74) *Attorney, Agent, or Firm* — Dawn Jos; Charles A. Brill; Frank D. Cimino

(57) ABSTRACT

An electronic device (100) includes a substrate (110) and an integrated circuit (120) provided on the substrate (110) having a surface facing away from the substrate (110). An insulating layer (150) extends over the substrate (110) and around the integrated circuit (120) to define an interface (154) between the insulating layer (150) and the integrated circuit (120). An electrically conductive via (130) is provided on the surface of the integrated circuit (120). An insulating material (140) extends over the via (130) and includes an opening (142) exposing a portion of the via (130). A repassivation member (162) extends over the insulating layer (150) and has a surface (164) aligned with the interface (154). An electrically conductive redistribution member (181) is electrically connected to the via (130) and extends over the repassivation member (162) into contact with the insulating layer (150).

14 Claims, 6 Drawing Sheets

(51) Int. Cl.
*H01L 23/31* (2006.01)
*H01L 23/00* (2006.01)

(52) U.S. Cl.
CPC ........ *H01L 23/3114* (2013.01); *H01L 23/528* (2013.01); *H01L 24/05* (2013.01); *H01L 2224/02379* (2013.01); *H01L 2224/04105* (2013.01); *H01L 2924/14* (2013.01); *H01L 2924/15172* (2013.01)

(56) References Cited

U.S. PATENT DOCUMENTS

| | | | | |
|---|---|---|---|---|
| 7,534,652 | B2 * | 5/2009 | Haba | H01L 22/34 |
| | | | | 438/108 |
| 7,642,627 | B2 * | 1/2010 | Yamasaki | H01L 24/10 |
| | | | | 257/665 |
| 8,361,842 | B2 * | 1/2013 | Yu | H01L 21/561 |
| | | | | 257/E21.499 |
| 9,583,462 | B2 | 2/2017 | Lee et al. | |
| 2003/0067062 | A1 * | 4/2003 | Hedler | H01L 24/72 |
| | | | | 257/678 |
| 2016/0365324 | A1 * | 12/2016 | Kim | H01L 24/32 |
| 2017/0345731 | A1 * | 11/2017 | Chiang | H01L 24/19 |
| 2019/0148340 | A1 * | 5/2019 | Yu | H01L 24/24 |
| | | | | 257/737 |

* cited by examiner

FAN-OUT ELECTRONIC DEVICE

SUMMARY

In one aspect, an electronic device includes a substrate and an integrated circuit provided on the substrate having a surface facing away from the substrate. An insulating layer extends over the substrate and around the integrated circuit to define an interface between the insulating layer and the integrated circuit. An electrically conductive via is provided on the surface of the integrated circuit. An insulating material extends over the via and includes an opening exposing a portion of the via. A repassivation member extends over the insulating layer and has a surface aligned with the interface. An electrically conductive redistribution member is electrically connected to the via and extends over the repassivation member into contact with the insulating layer.

In another aspect, a method of forming an electronic device includes securing an electrically conductive via to a first surface of an integrated circuit. An opposing second surface of the integrated circuit is secured to a substrate. The integrated circuit is embedded in an insulating layer to define an interface between the insulating layer and the integrated circuit. An insulating material is overmolded over a portion of the via. A repassivation member having a surface aligned with the interface is printed onto the insulating layer. An electrically conductive redistribution member is electroplated into electrical contact with the via and extends over the repassivation member into contact with the insulating layer.

Other objects and advantages and a fuller understanding of the disclosure will be had from the following detailed description and the accompanying drawings.

BRIEF DESCRIPTION OF THE DRAWINGS

FIG. 3 is a top view of FIG. 2.

DETAILED DESCRIPTION

Figure 1:
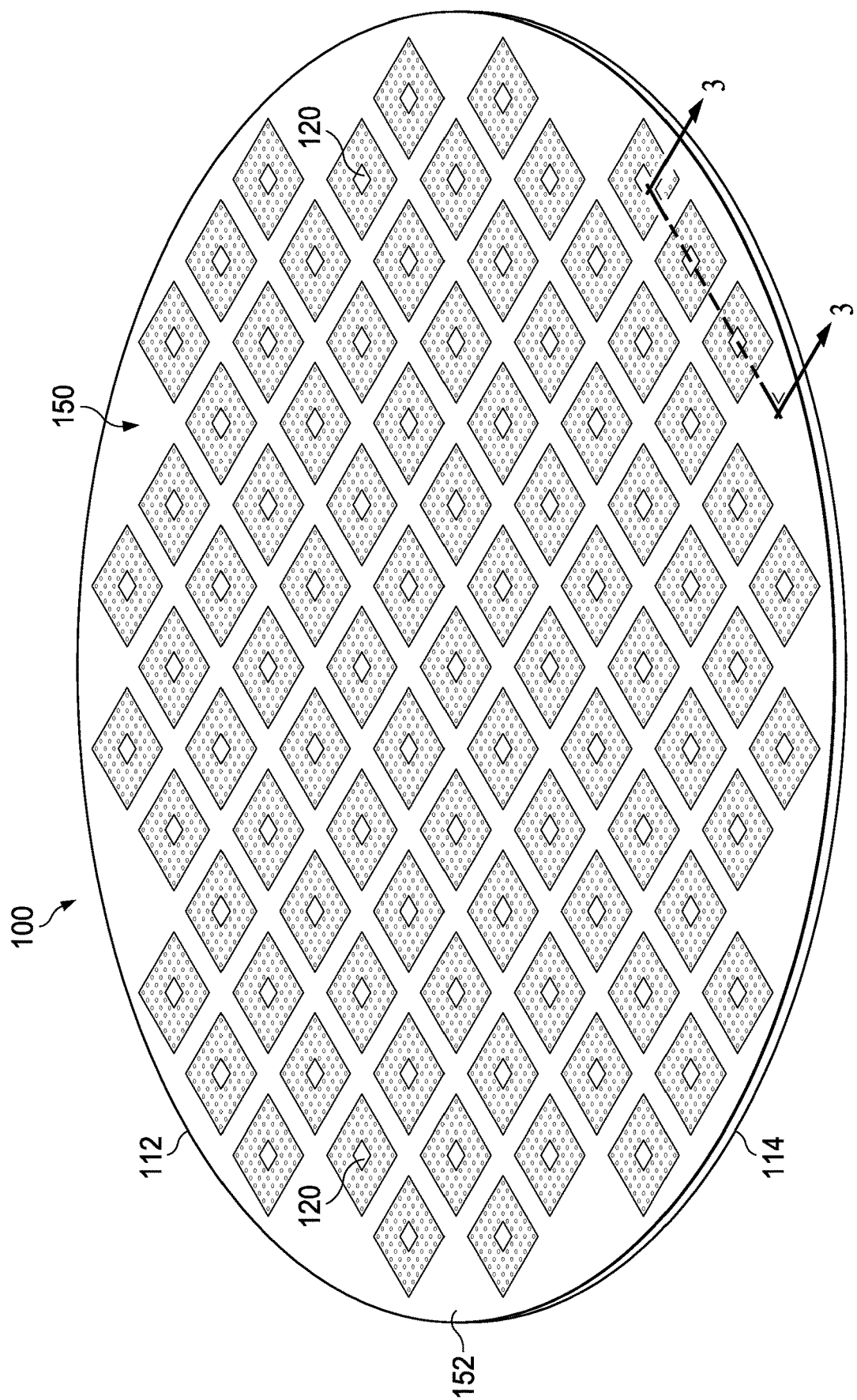
FIG. 1 is a top view of an example fan-out electronic device.
Figure 2:
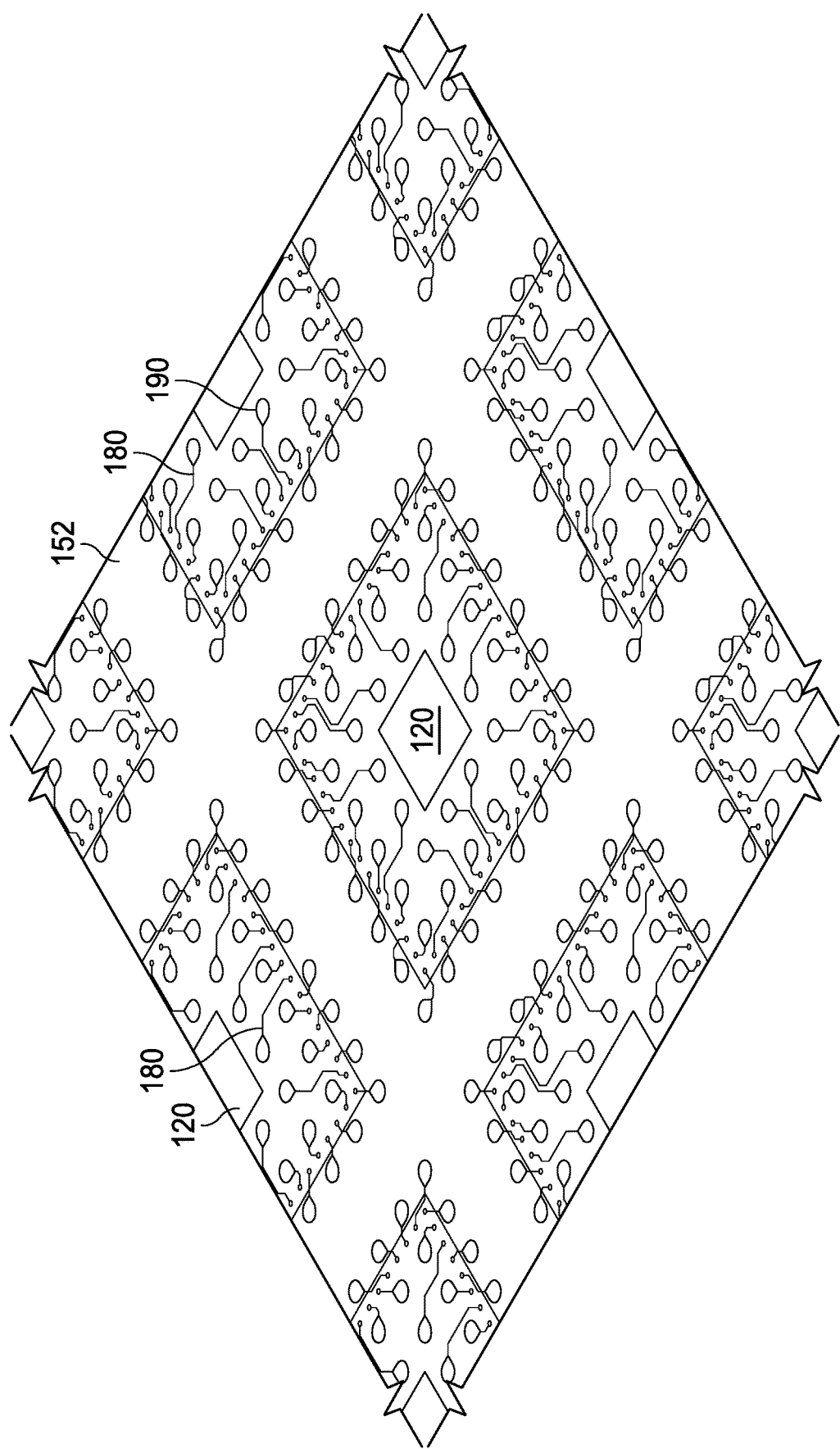
FIG. 2 is an enlarged view of a portion of FIG. 1.

FIGS. 1-2 illustrate an example electronic device. The electronic device can be, for example, a wafer-level chip scale package (WLCSP) of integrated circuits. Alternatively, the electronic device can be on the chip or die scale, printed circuit board scale or panel scale. Consequently, the electronic device can be on the millimeter size scale or up to several feet in size.

Figure 3:
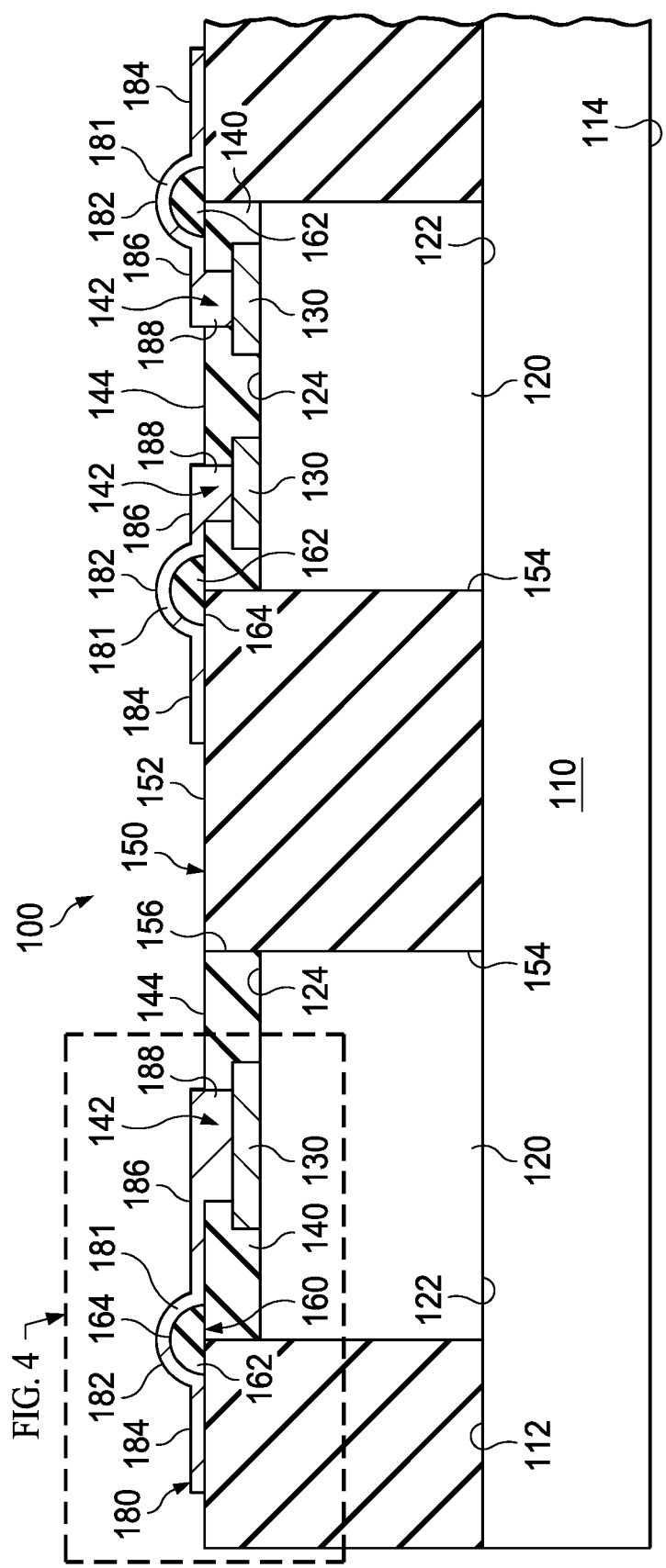
FIG. 3 is a section view taken along line 3-3 of FIG. 1.
Figure 4:
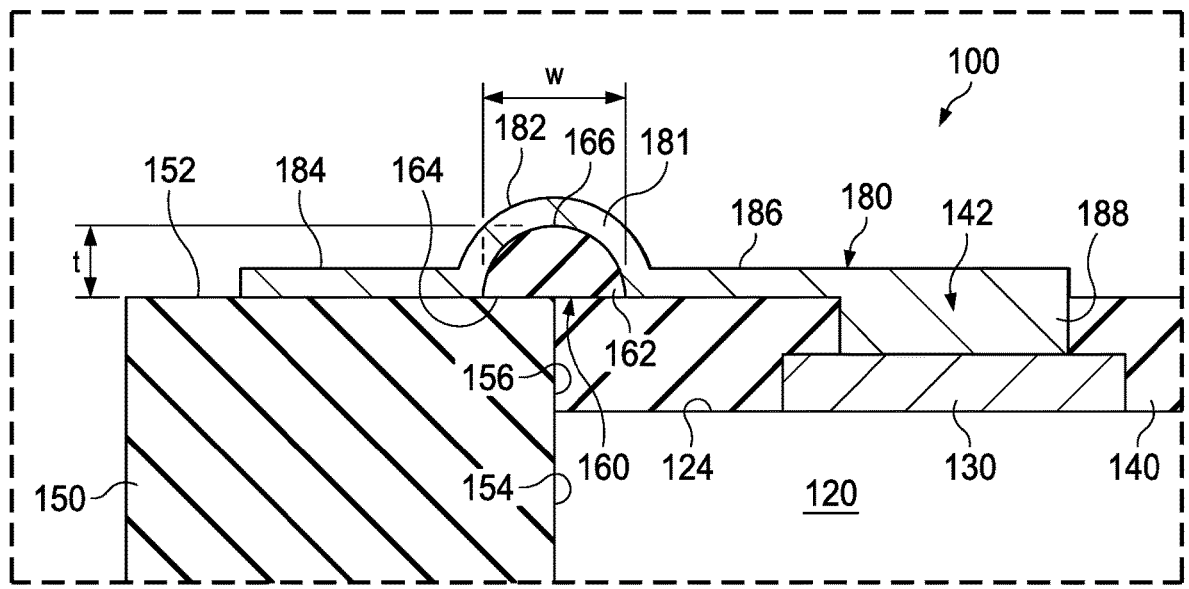
FIG. 4 is an enlarged view of a portion of FIG. 3.

As shown, the electronic device is a WLCSP 100. The electronic device 100 includes a wafer or substrate 110 (as shown in FIGS. 3 and 4) having a first side 112 and a second side 114. The substrate 110 can be circular and have a diameter of about 300 mm, one or more integrated circuits 120 provided on the substrate, and an insulating layer 150 extending over the substrate and around/between the integrated circuits. Referring to FIG. 3, taken along 3-3 in FIG. 1, the substrate 110 has a first side 112 and an opposing second side 114. Alternatively, the substrate 110 can be square or rectangular (not shown). The substrate 110 can be formed from a semiconductor material, such as silicon, gallium nitride or silicon carbide.

The integrated circuits 120 are provided on the first side 112 of the substrate 110 via adhesive, pins, ball grid array (BGA) or the like. The integrated circuits 120 can be arranged in a grid or array equidistantly spaced from one another about the first side 112. Depending on the size of the substrate 110 and integrated circuits 120, thousands or tens of thousands of integrated circuits can be arranged on the first side 112 of the substrate. Each integrated circuit 120 includes a first surface 122 and an opposing second surface 124. The first surface 122 can contact the substrate 110 or be spaced therefrom. In either case, the first surface 122 faces the substrate 110. The second surface 124 faces away from the substrate 110. Each integrated circuit 120 can have a polygonal or circular shape. As shown, the integrated circuits 120 are rectangular and therefore have a rectangular perimeter.

One or more vias 130 formed from an electrically conductive material are provided on the second surface 124 of each integrated circuit 120 for redistributing and/or routing power to and from the integrated circuits. The vias 130 can be formed from a conductive material, such as a metal including copper or aluminum. The vias 130 can be formed from one or more layers of conductive material stacked vertically (as shown) away from the integrated circuits 120.

A layer of electrically insulating material 140 extends over the vias 130 and covers the entire second surface 124 of the integrated circuits 120 not covered by the vias. In one example, the material 140 is a thermosetting material such as polyimide. One or more slots or openings 142 extend from an outer surface 144 of the material 140 entirely therethrough to expose portions of the vias 130. Each opening 142 can have a constant cross-sectional area or a cross-sectional area that varies along its depth (not shown).

The layer 150 of insulating material contacts the first side 112 of the substrate 110 and extends to a location substantially coplanar with the outer surface 144 of the material 140. In this condition, the layer 150 extends around and between the integrated circuits 120 and forms an interface 154 therewith. The interface 154 extends along the entire perimeter of the integrated circuit 120 and has a length completely surrounding or encircling the integrated circuit. The interface 154 can therefore have a polygonal or circular shape. As shown in FIG. 4, the insulating layer 150 also forms an interface 156 with the material 140. In one example the electronic device includes a substrate 110 having a first surface 122 and an integrated circuit 120 on the first surface 122. The integrated circuit 120 includes a second surface 124 facing away from the substrate 110, and a lateral surface, taken along the interface 154, extending transverse to the first surface 122. The electrically conductive via 130 is on the second surface 124. The electronic device includes an insulating layer 150 interfacing with the lateral surface taken along the interface 154, the insulating layer including a third surface 144 facing away from the substrate 110. A repassivation member 162 is on the third surface 144, and positioned such that a line along the interface 154 extending away from the substrate 110 along the lateral surface passes through the repassivation member 162. The device further includes an electrically conductive redistribution member 181 in contact with the third surface 144 on a first side of the repassivation member 162 as shown in FIG. 3, and in contact with the via 130 on a second side of the repassivation member 162 opposite the first side. The redistribution member 181 extends over the repassivation member 162 between the first and second sides as shown in FIG. 3.

In one example, the insulating layer 150 is overmolded over and around the integrated circuits 120 once the integrated circuits are secured to the substrate 110. Regardless of the process used, the integrated circuits 120 are embedded in the surrounding insulating layer 150. The insulating layer 150 can be formed from, for example, a curable epoxy or resin.

A repassivation layer 160 is formed along an outer surface 152 of the insulating layer 150 and includes repassivation members 162 aligned with the interfaces 154 between the insulating layer and the integrated circuits 120. To this end, at least a portion of each repassivation member 162 extends along the same path on the electronic device 100 as the interface 154 but at a different vertical location (as shown in FIG. 4) from the interface 154. The repassivation members 162 also extend to both sides of the interface 154, i.e., towards the integrated circuit 120 and towards the insulating layer 150. The cross-section of each repassivation member 162 can be symmetric relative to the interface 154.

In FIG. 4, the interfaces 154, 156 are coextensive and, thus, the repassivation members 162 are also aligned with the interfaces 156. However, the interfaces 156 and repassivation members 162 can be offset from one another if, for example, the insulating layer 150 extends onto the second surfaces 124 of the integrated circuits 120 (not shown).

Each repassivation member 162 includes a first surface 164 engaging the outer surface 152 of the insulating layer 150 and the outer surface 144 of the material 140. The first surface 164 is spaced from the interface 156 and therefore spaced from the material 140 when the insulating layer 150 extends onto the second surface 124 (not shown). In any case, the first surface 164 is planar and aligned with the interface 154. A curved or arcuate, e.g., hemispherical, second surface 166 of the repassivation member 162 faces away from the insulating layer 150 and is also aligned with the interface 154.

Figure 5:
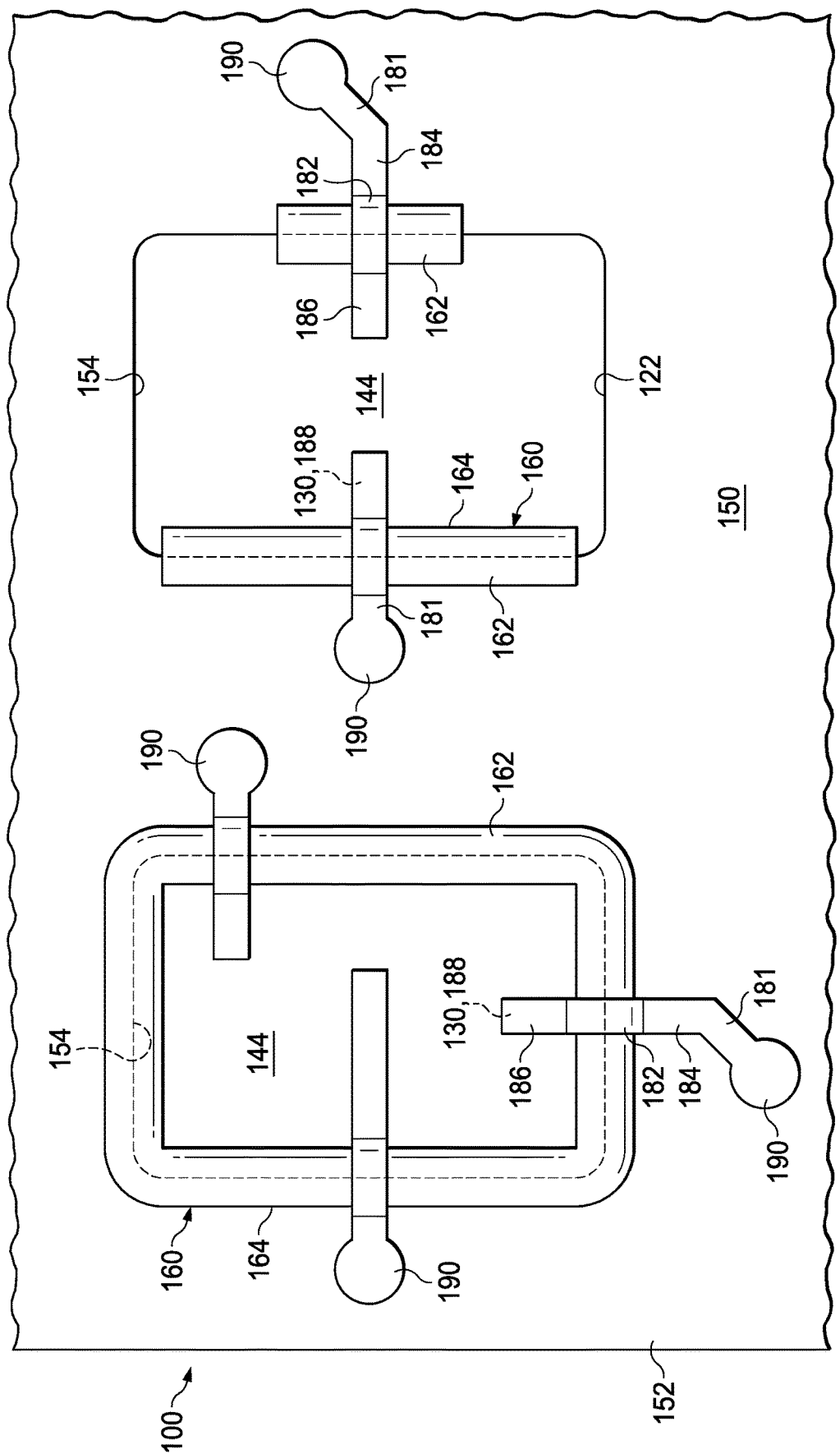
FIG. 5 is a top view of a portion of FIG. 1.

One or more of the repassivation members 162 is associated with each integrated circuit 120. For instance, and referring to FIG. 5, a single repassivation member 162 can extend the entire length of the interface 154 and therefore have the same shape and size as the perimeter of the integrated circuit 120 (leftmost repassivation member in FIG. 5). Alternatively, multiple repassivation members 162 can be aligned with different, discrete portions of the interface 154 and integrated circuit 120 perimeter (rightmost repassivation members shown in FIG. 5). These repassivation members 162 therefore each have a length less than the length of the interface 154. Regardless, each repassivation member 162 can have a width w extending generally parallel to the first surface 164 (and perpendicular to the interface 154) (FIG. 4) greater than about 5 μm. The repassivation members 162 can have a thickness t extending away from the first surface 164 (and parallel to the interface 154) of about 1 μm to about 30 μm or thicker.

In one example, the repassivation members 162 are deposited onto the insulating layer 150 and material 140 by inkjet printing an ink residue. The printing can be achieved with a high resolution of about ±1-2 μm. A single layer pass of each repassivation member 162 can have a width w of about 10-15 μm and a thickness t up to about 8 μm.

The repassivation members 162 can be made from an electrically insulating material. The viscosity and print speed is taken into account when selecting the material used for the repassivation members 162 to ensure proper spreading and print thickness t. The repassivation members 162 can be made, for example, from epoxies, polyimides, bis maleimides, polybenzoxazole (PBO), benzocyclobutene (BCB), and UV-cured resins.

Inkjet printing the repassivation members 162 is advantageous because the printer head can print the pattern as desired without masking the deposition surface(s). Consequently, the printed repassivation members 162 are more efficient, quicker, and cheaper to apply to the electronic device 100 compared to other means of applying repassivation layers, such as by spin coating, slit coating, spray coating or lamination. Using a printing process also alleviates the additional masking, drying, etching, and cleaning steps needed in wet processes.

As shown in FIGS. 3-4, the electronic device 100 further includes an electrically conductive redistribution layer (RDL) 180 extending over the repassivation layer 160 and onto the material 140 and the layer 150. In one example, the RDL 180 is formed from a conductive material either electroplated, sputtered, or evaporated over the material 140 and the layer 150. Example materials include copper (electroplated) and aluminum (sputtered or evaporated). The RDL 180 includes redistribution elements or members 181 that extend from each opening 142 in the material 140, over one of the repassivation members 162, and to locations spaced laterally from the integrated circuits 120 and over the insulating layer 150.

Each redistribution member 181 includes a base 182 contoured to the shape of the second surface 166 of the associated repassivation member 162. The base 182 therefore has a generally curved or hemispherical shape. The shape of the second surface 166 helps mitigate stress on the redistribution members 181. First and second legs 184, 186 extend from the base 182 in generally opposite directions from one another. As shown, the legs 184, 186 extend 180° from each other, although other configurations are contemplated. The legs 184, 186 can have a planar shape and be the same shape as one another or different shapes.

A circular contact 190 (see FIG. 5) is formed at the end of the first leg 184. The second leg 186 includes a projection 186 extending through the opening 142 in the material 140 into contact with the exposed via 130. As a result, the contact 190 and projection 188 on each redistribution member 181 are electrically connected to one another. A ball grid array (BGA) (not shown) can be deposited on the contacts 190. Consequently, once the electronic device 100 is segmented into individual dies by dicing, e.g., by Mahoh saw, the dies can be secured to another electronic component and electrically connected thereto. The resulting dies (not shown) are therefore die-scale electronics devices.

Figure 6:
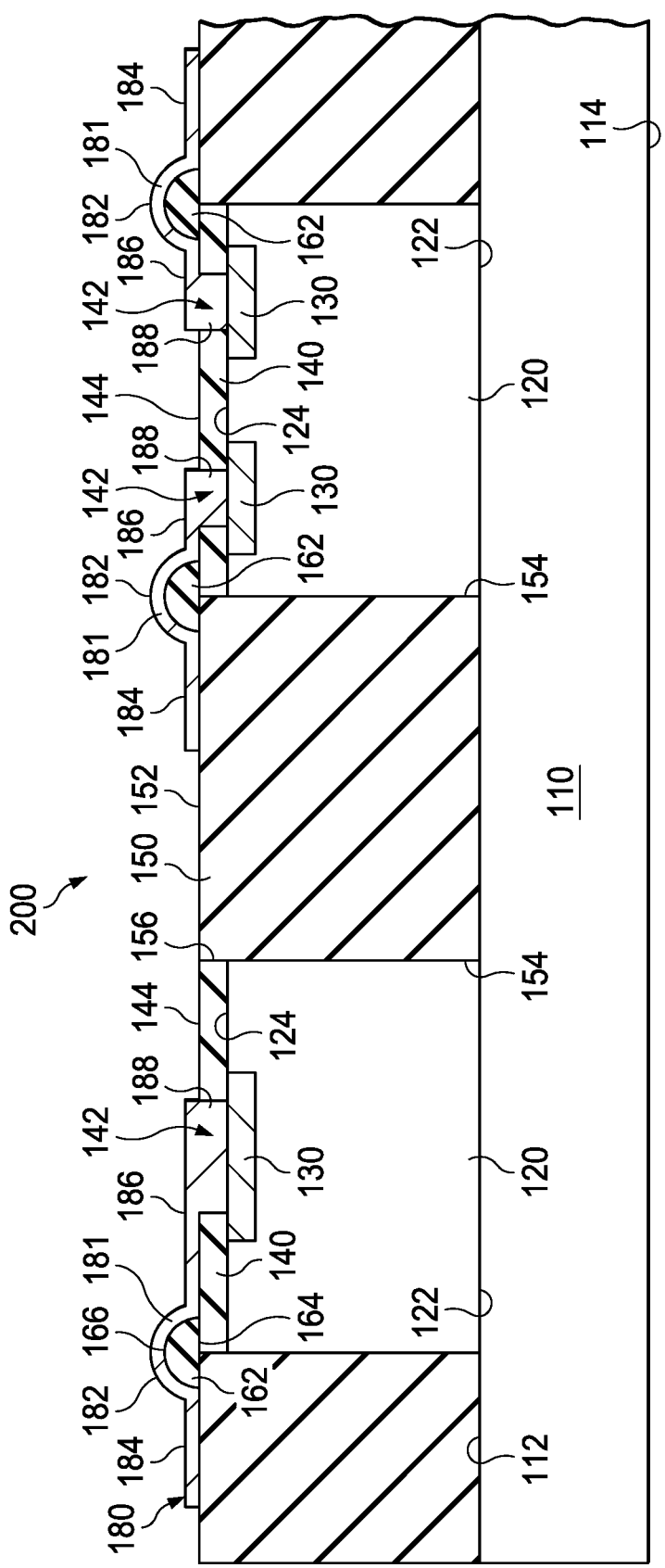
FIG. 6 is a section view of another example fan-out electronic device.

In another example electronic device shown in FIG. 6, each via 130 is embedded within the respective integrated circuit 120 such that the second surface 124 is coplanar or spaced outward of the via. The material 140 extends over the embedded vias 130 and includes the openings 142 exposing portions thereof. The repassivation members 162 are printed in the same manner aligned with the interface 156/integrated circuit 120 perimeter. The RDL 180 is then electroplated as described above into contact with the vias 130, over the repassivation members 162, and into contact with the insulating layer 150 between the integrated circuits 120.

Figure 7:
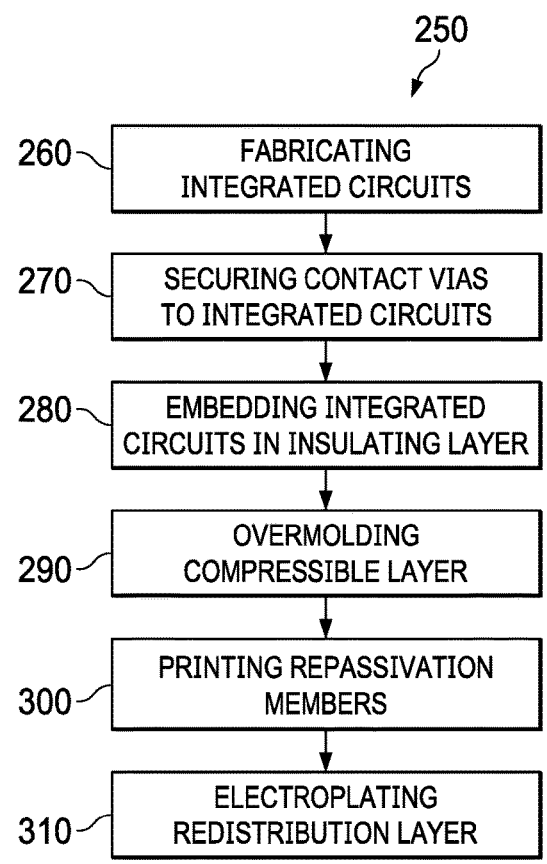
FIG. 7 is a flow chart illustrating a method of forming the fan-out electronic device of FIG. 1.

An example flowchart illustrating a method 250 of manufacturing the electronic device is shown in FIG. 7. In step 260, integrated circuits 120 are formed. In step 270, one or more contact vias 130 are secured to each integrated circuit 120. In step 280, the integrated circuits 120—with the vias 130 secured thereto—are secured to a substrate 110 in a spaced-apart manner and then embedded in the insulating layer 150. This forms the interface 154 between the insulating layer 150 and the perimeter of each integrated circuit 120. At step 290, the insulating material 140 is overmolded over the embedded integrated circuit 120 in a manner that exposes portions of the vias 130. At step 300, the repassivation layer 160 is inkjet printed along a path aligned with a portion(s) or all of the interface 154. At step 310, the RDL 180 is electroplated into contact with the exposed portions of the vias 130, over the repassivation members 162 and into contact with the insulating layer 150.

The electronic device described herein is advantageous because the repassivation members help increase the breakdown voltage of the area aligned with the perimeter of the integrated circuits. More specifically, the repassivation members increase the distance between the insulating layer/integrated circuit interface and the redistribution members and fill the extra distance with an electrically insulating material chosen to increase the breakdown voltage.

Breakdown voltage is directly dependent on the material selected and its thickness. In existing fan-out devices, multiple insulating layers are built up at the insulating layer/integrated circuit interface area to provide a breakdown voltage of about 30-60 V/μm, depending on the dielectric selected. In high voltage applications, the additional insulating layers are thick enough that additional via layers are also required. This not only increases the manufacturing time and expense but also reduces the electrical efficiency of the vias by lengthening the electrical path.

In contrast, printing the repassivation layer shown and described can increase the breakdown voltage to exceed 1000V, thereby allowing the electronic device to be used in high voltage applications at lower manufacturing cost and with fewer process steps as the vias can be electroplated in a single layer. Furthermore, the repassivation layer helps electrically insulate the RDL from the integrated circuits by moving the high voltage electrical paths away from the grounded areas in the electronic device in an efficient manner.

To this end, the RDL necessarily crosses the integrated circuit edges to reach the inter-integrated circuit areas along the outer surface of the insulating layer. Consequently, when the conductive RDL layer carries high voltage, there is the potential for leakage and shorting between redistribution members and along the RDL element/integrated circuit interface. Any defects in the insulating material or caused by applying the insulating material to the electronic device can further exacerbate the issue by reducing the breakdown voltage in the material.

The repassivation elements described herein alleviate the need for additional insulating layers between the integrated circuits and the RDL layer, thereby shortening the electrical path therebetween. This, in turn, reduces the depths/number of any vias needed and thereby reduces the overall size of the electronic device.

What have been described above are examples of the present disclosure. It is, of course, not possible to describe every conceivable combination of components or methodologies for purposes of describing the present disclosure, but one of ordinary skill in the art will recognize that many further combinations and permutations of the present disclosure are possible. Accordingly, the present disclosure is intended to embrace all such alterations, modifications and variations that fall within the spirit and scope of the appended claims.

What is claimed is:

1. An electronic device comprising:
   a substrate;
   an integrated circuit on the substrate and including a first surface facing away from the substrate;
   an insulating layer extending over the substrate and around the integrated circuit to define an interface between the insulating layer and the integrated circuit along a lateral surface of the integrated circuit;
   an electrically conductive via on the first surface of the integrated circuit,
   an insulating material extending over the via and including an opening exposing a portion of the via;
   a repassivation member extending over the insulating layer, the repassivation member aligned with the interface such that the lateral surface of the integrated circuit is between the repassivation member and the substrate in a direction extending perpendicular to a surface of the substrate; and
   an electrically conductive redistribution member electrically connected to the via and extending over the repassivation member into contact with the insulating layer; wherein the repassivation member includes a hemispherical shape.

2. The electronic device recited in claim 1, wherein the interface includes a polygonal shape and a length extending around a perimeter of the integrated circuit.

3. The electronic device recited in claim 2, wherein the repassivation member includes a length equal to a length of the interface.

4. The electronic device recited in claim 1, wherein the repassivation member includes a length less than a length of the interface.

5. The electronic device recited in claim 1, wherein the repassivation member includes an ink residue printed onto the insulating layer and the via.

6. The electronic device recited in claim 1, wherein the repassivation member includes a thickness extending parallel to the interface of at least 5 μm.

7. The electronic device recited in claim 1, wherein the repassivation member includes a width extending perpendicular to the interface of about 1 μm to about 10 μm.

8. The electronic device recited in claim 1, wherein the redistribution member includes a curved base extending over the repassivation member, a first leg including a projection engaging the via, and a second leg extending away from the first leg and contacting the insulating layer.

9. The electronic device recited in claim 1, wherein the repassivation member is formed from an insulating material.

10. The electronic device recited in claim 1, wherein a breakdown voltage of the repassivation member is at least 1000V.

11. The electronic device recited in claim 1, wherein the repassivation member contacts the insulating layer.

12. An electronic device comprising:
   a substrate including a first surface;
   an integrated circuit on the first surface, the integrated circuit including a second surface facing away from the substrate, the integrated circuit including a lateral surface extending transverse to the first surface;
   an electrically conductive via on the second surface;
   an insulating layer interfacing with the lateral surface, the insulating layer including a third surface facing away from the substrate;
   a repassivation member on the third surface, the repassivation member positioned such that a line extending away from the substrate along the lateral surface passes through the repassivation member;
   an electrically conductive redistribution member in contact with the third surface on a first side of the repassivation member and in contact with the via on a second side of the repassivation member opposite the first side, the redistribution member extending over the repassivation member between the first and second sides; and an insulating material extending between the insulating layer and the via, wherein the repassivation member directly contacts the insulating material.

13. The electronic device recited in claim 12, wherein the insulating material includes a fourth surface facing away from the substrate, a first portion of the repassivation member on the third surface and a second portion of the repassivation member on the fourth surface.

14. The electronic device recited in claim 12, wherein the repassivation member extends longitudinally along a path along the third surface, the path corresponding to a shape of the lateral surface.

* * * * *